United States Patent [19]

Hatzakis et al.

[11] Patent Number: 5,041,358
[45] Date of Patent: Aug. 20, 1991

[54] NEGATIVE PHOTORESIST AND USE THEREOF

[75] Inventors: Michael Hatzakis, Chappaqua, N.Y.; Jane M. Shaw, Ridgefield, Conn.; Kevin J. Stewart, Lake Peekskill, N.Y.

[73] Assignee: International Business Machines Corporation, Armonk, N.Y.

[21] Appl. No.: 339,049

[22] Filed: Apr. 17, 1989

[51] Int. Cl.$^5$ .......................... G03C 1/73; G03F 7/004
[52] U.S. Cl. ...................................... 430/280; 430/313; 430/323; 430/325; 522/31; 522/166; 525/487; 525/507
[58] Field of Search ............... 430/280, 313, 323, 325; 522/31, 166; 525/507, 487

[56] References Cited

U.S. PATENT DOCUMENTS

| | | | |
|---|---|---|---|
| 2,687,396 | 8/1954 | McLean | 525/487 |
| 3,725,341 | 4/1973 | Rogers et al. | 525/507 |
| 4,069,055 | 1/1978 | Crivello | 96/115 R |
| 4,175,972 | 11/1979 | Crivello | 204/159.18 |
| 4,193,799 | 3/1980 | Crivello et al. | 430/313 |
| 4,332,923 | 2/1982 | Rainear | 525/507 |
| 4,430,153 | 2/1984 | Gleason et al. | 156/643 |
| 4,547,431 | 10/1985 | Eckberg | 522/31 |
| 4,552,833 | 11/1985 | Ito et al. | 430/325 |
| 4,572,890 | 2/1986 | Goodin et al. | 430/325 |
| 4,593,052 | 6/1986 | Irving | 522/31 |
| 4,623,676 | 11/1986 | Kistner | 430/280 |
| 4,624,912 | 11/1986 | Zweifel et al. | 430/258 |
| 4,693,960 | 9/1987 | Babich et al. | 430/323 |
| 4,877,822 | 10/1989 | Itoh et al. | 525/487 |
| 4,882,201 | 11/1989 | Crivello et al. | 430/280 |
| 4,975,471 | 12/1990 | Hayase et al. | 522/166 |
| 4,981,909 | 11/1991 | Babich et al. | 430/270 |
| 4,985,342 | 1/1991 | Muromoto et al. | 430/280 |

FOREIGN PATENT DOCUMENTS

60-29738 2/1985 Japan .................................. 430/280

OTHER PUBLICATIONS

"UV Curing of Epoxides by Cationic Polymerization", *Radiation Curing* (7), Nov. 1986, William R. Watt.
Chemical Abstracts, vol. 91, Item 142166M, 1979.
Chemical Abstracts, vol. 94, Item 112539E, 1981.
Chemical Abstracts, vol. 86, Item 0180716V, 1977.

*Primary Examiner*—Marion E. McCamish
*Assistant Examiner*—Christopher D. RoDee
*Attorney, Agent, or Firm*—Pollock, Vande Sande & Priddy

[57] ABSTRACT

A composition containing a polymeric material obtained by interreacting an epoxy-novolak polymer with an organosilicon compound, a radiation sensitive onium salt, and a near U.V. sensitizer.

19 Claims, No Drawings

NEGATIVE PHOTORESIST AND USE THEREOF

DESCRIPTION

1. Technical Field

The present invention is concerned with compositions which are capable of being imaged upon exposure to actinic radiation. The compositions of the present invention are also resistant to oxygen-containing plasma. In addition, the present invention is concerned with the use of the compositions in lithography. For example, the compositions of the present invention are suitable for imaging on all optical lithography tools and for packaging applications, such as multi-layer ceramic packaging devices.

2. Background Art

In the manufacture of patterned devices, such as semiconductor chips and chip carriers, the processes of etching different layers which constitute the finished product are among the most crucial steps involved. One method widely employed in the etching process is to overlay the surface to be etched with a suitable mask and then to immerse the substrate and mask in a chemical solution which attacks the substrate to be etched while leaving the mask intact. These wet chemical processes suffer from the difficulty of achieving well-defined edges on the etched surfaces. This is due to the chemicals undercutting the mask and the formation of an isotropic image. In other words, conventional chemical wet processes do not provide the selectivity of direction (anisotropy) considered necessary to achieve optimum dimensional consistent with current processing requirements.

Moreover, such wet etching processes are undesirable because of the environmental and safety concerns associated therewith.

Accordingly, various so-called "dry processes" have been suggested to improve the process from an environmental viewpoint, as well as to reduce relative cost of the etching. Furthermore, these "dry processes" have the potential advantage of greater process control and higher aspect ratio images.

Such "dry processes" generally involve passing a gas through a container and creating a plasma in this gas. The species in this gas are then used to etch a substrate placed in the chamber or container. Typical examples of such "dry processes" are plasma etching, sputter etching, and reactive ion etching.

Reactive ion etching provides well-defined, vertically etched sidewalls. A particular reactive ion etching process is disclosed, for example, in U.S. Pat. No. 4,283,249 to Ephrath, disclosure of which is incorporated herein by reference.

One problem associated with "dry processing" techniques is providing a patternable material which is sensitive to imaging radiation while, at the same time, being sufficiently resistant to the dry etching environment. In many instances, resistance to the dry etching, such as to the plasma etching active species, results in erosion of the mask material and the loss of resolution of the material employed for preparing the mask in the lithographic exposure to the imaging radiation.

This is true for both positive organic resist materials and negative organic resist materials. A positive resist material is one which on exposure to imaging radiation is capable of being rendered soluble in a solvent in which the unexposed resist is not soluble. A negative resist material is one which is capable of polymerizing and/or insolubilizing upon exposure to imaging radiation.

One type of positive photosensitive material is based upon phenol-formaldehyde novolak polymers. A particular example of such is Shipley AZ1350 which is an m-cresol formaldehyde novolak polymer composition. Such is a positive resist composition and includes therein a diazoketone such as 2-diazo-1-naphthol-5-sulphonic acid ester. In such a composition the diazoketone, during the photochemical reaction, is converted to a carboxylic acid. This, in turn, converts a neutral-organic soluble molecule (the phenolic polymer) to one that is readily soluble in weakly alkali aqueous developer solvents.

The composition usually contains about 15%, or so, by weight of the diazoketone compound.

A discussion of various photoresist materials can be found, for instance, in the *Journal of the Electrochemical Society*, Vol. 125, No. 3, March 1980, Deckert, et al., "Microlithography-Key to Solid-State Fabrication", pp. 45C-56C, disclosure of which is incorporated herein by reference.

Additional discussion of the use of quinone diazides in light-sensitive applications can be found in "Quinone Diazides", Erschov, et al., *Elsevier Scientific Publications*, Amsterdam, 1981, Chapter 8, pp. 282-297, disclosure of which is incorporated herein by reference. In addition, it has been suggested therein to employ condensation products of 1,2-naphthoquinone-5-chlorosulphonic acid and certain silicon derivatives to improve the adhesion property of various films to a substrate whereby the condensation products are employed as light-sensitive backing therefor.

In addition, certain siloxanes have been suggested as reactive ion etch barriers. For instance, see Fried, et al., IBM, *Journal Research Development*, Vol. 26, No. 8, pp. 362-371. Also, certain siloxanes have been suggested as e-beam sensitive resists. For instance, see Roberts, *Journal of Electrochemical Society*, Vol. 120, p. 1716, 1973; Roberts, *Phillips Technical Review*, Vol. 35, pp. 41-52, 1975; and Gazard, et al., *Applied Polymer Symposium*, No. 23, pp. 106-107, 1974.

Moreover, there have been suggestions that certain siloxanes, when imaged with electron beam (see Hatzakis, et al., *Processing Microcircuit* Engineering (Lausanne), p. 396, September 1981); and deep U.V. at about 2537 Angstrom (see Shaw, et al., *SPE Photopolymer Conference.* November 1982) act as an etch mask for an underlying polymer layer in an oxygen plasma. However, these siloxane materials suggested require very limited method for imaging (e.g., e-beam and deep U.V.) and are not imagable with radiation of longer wavelengths (e.g., greater than 2700A), where the majority of lithographic imaging tools, contact, proximity, and projection printers operate.

U.S. Pat. No. 4,603,195 to Babich, et al. discloses materials which are resistant to dry-processing techniques and especially to reactive ion etching in oxygen plasma while, at the same time, capable of providing high resolution images. The compositions disclosed therein are obtained by interreacting a quinone diazo compound and an organosilicon compound and function as negative resist materials.

In addition, examples of some dry-developable resists are provided in U.S. Pat. Nos. 4,426,247 to Tamamura, et al.; 4,433,044 to Meyer, et al.; 4,357,369 to Kilichowski, et al.; 4,430,153 to Gleason, et al.; 4,307,178 to Kaplan, et al.; 4,389,482 to Bargon, et al.; and 4,396,704 to Taylor. In addition, German patent application OS32 15082 (English language counterpart British patent application 2097143) suggests a process for obtaining negative tone plasma resist images. Such is concerned with a process involving entrapment of a silicon-containing monomer into a host film at the time of exposure to radiation and requires a processing step to expel the unincorporated silicon monomer from the film before plasma developing of the relief image.

A more recent example of a plasma developable resist is described in U.S. Pat. No. 4,552,833 in which a method is provided for obtaining a resist which is stated to be radiation sensitive and oxygen plasma developable. Such process involves coating a substrate with a film of a polymer that contains a masked reactive functionality, imagewise exposing the film to radiation under conditions that cause unmasking of the reactive functionality in the exposed regions of the film, treating the exposed film with a reactive organometallic reagent, and then developing the relief image by treatment with an oxygen plasma. The specific organometallic reagents described therein are trimethylstannyl chloride, hexamethyldisilazane, and trimethylsilyl chloride.

In addition, a method of obtaining a two-layer resist by top imaging a single layer resist is described in U.S. patent application Ser. No. 679,527 (FI9-84046, assigned to the assignee of the present application) which employs a monofunctional organometallic reagent.

Moreover, U.S. patent application Ser. No. 713,509 (assigned to the assignee of the present application) discloses oxygen plasma resistant materials obtained by reacting a polymeric material with a multifunctional organometallic material. The organometallic material contains at least two functional groups which are reacted with reactive groups of the polymeric material. The polymeric material contains reactive hydrogen functional groups and/or reactive hydrogen functional precursor groups.

The disclosures of the above two U.S. patent applications are incorporated herein by reference.

A further disclosure of photosensitive compositions containing organosilicon compounds can be found in U.S. Pat. No. 4,693,960.

Moreover, photopolymerizable compositions that contain an epoxy polymer and various radiation sensitive onium salts have been suggested. For instance, see U.S. Pat. Nos. 4,069,055; 4,175,972; 4,572,890; 4,593,052; and 4,624,912.

SUMMARY OF INVENTION

The present invention provides materials that are resistant to dry-processing techniques and especially to reactive ion etching in oxygen plasma, while at the same time capable of providing high resolution images. The materials of the present invention provide for negative resist materials. In addition, the materials of the present invention can be made highly sensitive to e-beam, X-ray, ion beam, deep U.V. irradiation (<3000 angstroms and near U.V. radiation (>3000 angstroms). The compositions of the present invention are also thermally stable. In addition, the compositions of the present invention exhibit good adhesion to a variety of substrates.

The present invention is concerned with a composition that contains:

A) a polymeric material obtained by interreacting an epoxy novolak polymer with an organosilicon compound; and B) a radiation sensitive onium salt.

One skilled in the art will appreciate that the composition of A) and B) may also include a near U.V. sensitizer such as anthracene derivatives for exposure at >3000 angstroms.

The onium salt is present in amounts to increase the sensitivity of the composition to e-beam, X-ray, ion beam and deep U.V. irradiation. The sensitizer is present to provide sensitivity to near U.V. radiation.

The present invention is also concerned with a process for providing an image which includes providing on a substrate a layer of the organosilicon and phenolic compositions of the type disclosed above, imagewise exposing the layer to imaging radiation in a desired pattern and developing the exposed layer, thereby leaving the desired pattern remaining on the substrate.

BEST AND VARIOUS MODES FOR CARRYING OUT INVENTION

The polymeric materials employed in the present invention are obtained by interreacting an epoxy novolak with an organosilicon compound. The epoxy novolak employed can be represented by the formula:

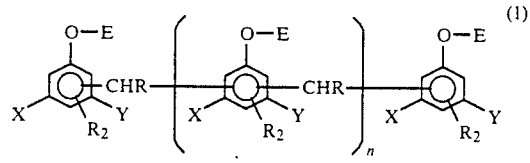

wherein n is at least about 0.2; E is hydrogen or an epoxyalkyl group, at least two E groups per polymer molecule being an epoxyalkyl group and wherein the epoxyalkyl group is represented by the formula:

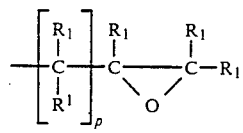

p is an integer from 1-8; R is hydrogen or alkyl or alkylene or aryl or aralkyl or alkaryl or cycloalkyl or furyl group; each $R_1$ individually is hydrogen or alkyl group of up to 7 carbon atoms; wherein the number of carbon atoms in any epoxyalkyl group totals no more than 10 carbon atoms; each X and Y is individually hydrogen or chlorine or alkyl or hydroxy; each $R_2$ individually is hydrogen or chlorine or a hydrocarbon group such as alkyl, aryl, aralkyl, alkaryl, and cycloalkyl.

The preferred epoxidized novolak employed according to the present invention is represented by the formula:

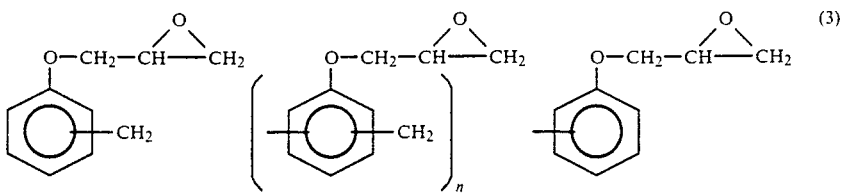

(3)

wherein n is at least about 0.2. The epoxidized novolak can be a liquid, semisolid, or solid, depending upon its molecular weight. Epoxy polymers, wherein n is about 1.5 to about 3.5 are commercially available and are generally suitable for the purposes of the present invention. More preferred epoxy polymers are represented by the above formula wherein n is at least about 4. The most preferred epoxy polymers employed according to the present invention are those wherein n is from about 4 to about 20. Mixtures of epoxidized novolak polymers of the above formula with different molecular weights can be employed when desired.

Those epoxidized novolak polymers which are non-liquids are the preferred ones to employ according to the present invention. For instance, the liquid novolak polymers are not particularly preferred since the use thereof does not provide as good pattern definition in screen-printing processes as achieved by using non-liquid epoxidized novolak polymers because of bleedout occurring during such processes. A discussion of some suitable novolak polymers can be found in a publication by Dow entitled "Dow epoxy novolak resins", 1972, Form No. 190-20-72.

The organosilicon materials employed include functional groups capable of reacting with epoxide groups of the epoxy novolak to produce a silylated epoxide. The preferred organosilicon materials are monomeric and are monofunctional (i.e., contain one functional group capable of reacting with the epoxide ring of the epoxy novolak). Examples of suitable organosilicon materials include trimethylsilyl chloride with the preferred material being tris (trimethylsiloxy) chlorosilane.

The amount of organosilicon compound is such as to react with at least 25% and preferably with about 30% to about 60% of the available epoxide moieties of the epoxy novolak. It is essential that sufficient epoxy groups remain unreacted to provide for the desired degree of crosslinking upon exposure to the irradiation. Generally, about 70% to about 40% and preferably about 75% to about 50% of the available epoxy groups are not reacted with the organosilicon compound.

The reaction between the epoxy novolak and organosilicon compound in accordance with the present invention is usually carried out in the presence of a catalytic amount of pyridine or tertiary organic amine. The reaction is usually carried out at temperatures of about normal room temperature to about 60° C. and preferably about normal room temperature. The reaction is generally carried out under atmospheric pressure or in an inert atmosphere. However, higher or lower pressure can be employed when desired. The reaction usually takes between 1 hour and about 4 hours.

The reaction is usually carried out in the presence of an inert diluent such as diglyme, methyl isobutyl ketone, propylene glycol, methyl ether acetate, and ethyl acetate.

The amount of organosilicon material is usually about 0.25 to about 0.75 moles and preferably about 0.4 to about 0.6 moles per mole of epoxy novolak.

The compositions of the present invention also contain a radiation sensitive onium salt. The radiation sensitive onium salt is present in amounts effective to increase the radiation sensitivity of the composition and usually about 1% to about 10% by weight, and preferably about 1% to about 5% by weight based upon the weight of the epoxy novolak.

Examples of suitable onium salts include aromatic onium salts of Group IV elements discussed in U.S. Pat. No. 4,175,972, disclosure of which is incorporated herein by reference, and aromatic onium salts of Group Va elements discussed in U.S. Pat. No. 4,069,055, disclosure of which is incorporated herein by reference.

Aromatic Group IVa onium salts include those represented by the formula:

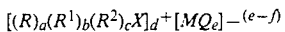

where R is a monovalent aromatic organic radical, $R^1$ is a monovalent organic aliphatic radial selected from 1 alkyl, cycloalkyl and substituted alkyl, $R^2$ is a polyvalent organic radical forming a heterocyclic or fused ring structure selected from aliphatic radicals and aromatic radicals, X is a Group IVa element selected from sulfur, selenium, and tellurium, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3 or the valence of X, $d = e - f$ f = valence of M and is an integer equal to from 2 to 7 inclusive, e is >f and is an integer having a value up to 8.

Radicals included by R are, for example, $C_{(6-13)}$ aromatic hydrocarbon radicals such as phenyl, tolyl, naphthyl, anthryl, and such radicals substituted with up to 1 to 4 monovalent radicals such as $C_{(1-8)}$ alkoxy, $C_{(1-8)}$ alkyl, nitro, chloro, and hydroxy; arylacyl radicals such as benzyl and phenylacyl; aromatic heterocyclic radicals such as pyridyl and furfuryl. $R^1$ radicals include $C_{(1-8)}$ alkyl such as methyl and ethyl, substituted alkyl such as —$C_2H_4OCH_3$, —$CH_2COOC_2H_5$, —$CH_2COCH_3$, etc. $R^2$ radicals include such structures as:

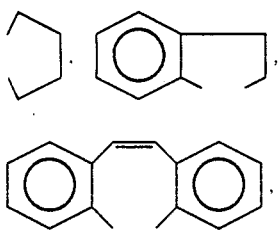

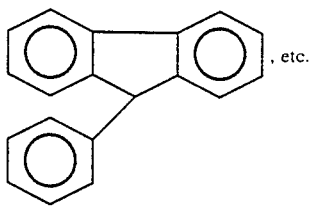, etc.

Complex anions included by $MQ_e^{-(e-f)}$ of Formula I are, for example, $BF_4^-$, $PF_6^-$, $SbF_6^-$, $FeCl_4^-$, $SnCl_6^-$, $SbCl_6^-$, $BiCl_5^-$, $AlF_6^{-3}$, $GaCl_4^-$, $InF_4^-$, $TiF_6^-$, $ZrF_6^-$, etc., where M is a transition metal such as Sb, Fe, Sn, Bi, Al, Ga, In, Ti, Zr, Sc, V, Cr, Mn, Cs, rare earth elements such as the lanthanides, for example, Ce, Pr, Nd, etc., actinides, such as Th, Pa, U, Np, etc. and metalloids such as B, P, and As.

Group VIa onium salts included by Formula I are, for example:

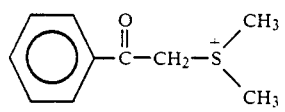 $BF_4^-$

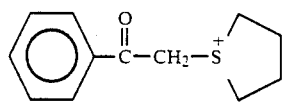 $PF_6^-$

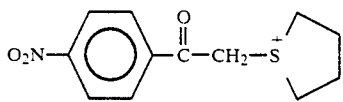 $AsF_6^-$

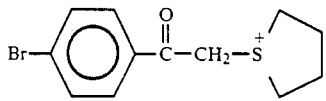 $SbF_6^-$

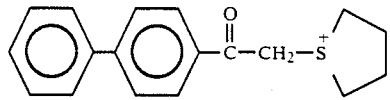 $FeCl_4^-$

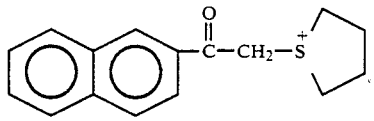 $SnCl_6^-$

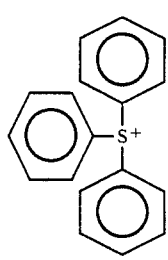 $SbF_6^-$

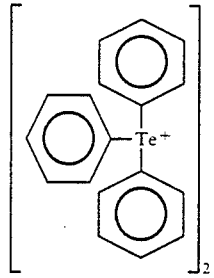 $BiCl_5^=$

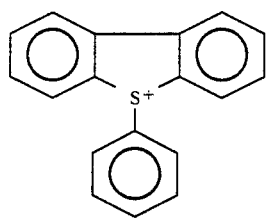 $BF_4^-$

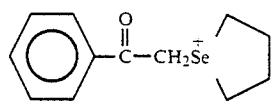 $PF_6^-$

Aromatic group Va onium salts include those represented by the formula:

$$[(R)_a(R^1)_b(R^2)_cX^1]_d^+[MQ_a]^{-(e-f)} \qquad (2)$$

where R is a monovalent aromatic organic radical selected from carbocyclic radicals and heterocyclic radicals, $R^1$ is a monovalent organic aliphatic radical selected from alkyl, alkoxy, cycloalkyl and substituted derivatives thereof, $R^2$ is a polyvalent organic radical forming an aromatic heterocyclic or fused ring structure with $X^1$, $X^1$ is a Group Va element selected from N, P, As, Sb, and Bi, M is a metal or metalloid, Q is a halogen radical, a is a whole number equal to 0 to 4 inclusive, b is a whole number equal to 0 to 2 inclusive, c is a whole number equal to 0 to 2 inclusive, and the sum of a+b+c is a value equal to 4 or the valence of $X^1$, $$d = e - f$$

f = valence of M and is an integer equal to from 2 to 7 inclusive, e is >f and is an integer having a value up to 8.

Radicals included by R are, for example, $C_{(6-13)}$ aromatic hydrocarbon radicals such as phenyl, tolyl, naphthyl, anthryl and such radicals substituted with up to 1 to 4 monovalent radicals such as $C_{(1-8)}$ alkoxy, $C_{(1-8)}$ alkyl, nitro, chloro, and hydroxy; arylacyl radicals such as phenylacyl; arylalkyl radicals such as phenyl ethyl; aromatic heterocyclic radicals such as pyridyl and furfuryl; $R^1$ radicals include $C_{(1-8)}$ alkyl, $C_{(3-8)}$ cycloalkyl, substituted alkyl such as haloalkyl, for example, chloroethyl; alkoxy such as $OCH_2C_6H_5$ and $OCH_3$; alkoxyalkyl such as $-C_2H_4OCH_3$; alkylacyl such as $-CH_2COOC_2H_5$; ketoalkyl such as $-CH_2COCH_3$.

Radicals included by $R^2$ are, for example:

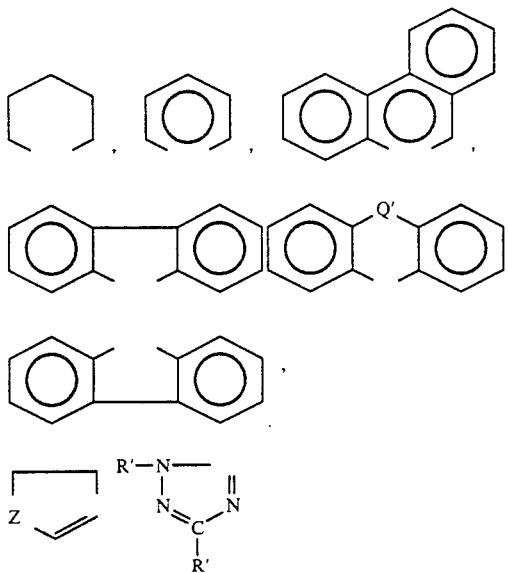

where Q' is selected from O, CH$_2$, N, R, and S; Z is selected from —O—, —S— and

and R' is a monovalent radical selected from hydrogen and hydrocarbon. Complex anions included by MQ$_e^{-\cdot(e-f)}$ are, for example, BF$_4^-$, PF$_6^-$, AsF$_6^-$, FeCl$_4^=$, SnCl$_6^-$, SbCl$_6^-$, BiCl$_5^=$, where M is more particularly a transition metal such as Sb, Fe, Sn, Bi, Al, Ga, In, Ti, Zr, Sc, V, Cr, Mn, and Co; rare earth elements such as the lanthanides, for example, Ce, Pr, and Nd; actinides such as Th, Pa, U, and Np; and metalloids such as B, P, and As.

In addition, it is noted that the compounds of the present invention can be admixed with conventional additives such as fillers, plasticizers, and diluents.

When used as a lithographic material, the compositions of the present invention are applied to a desired substrate to provide films, generally about 1500 angstroms to about 1 mil thick, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip.

In addition, the materials of the present invention can be used in conjunction with those substrates employed as chip carriers and including ceramic substrates and, especially, multilayer ceramic devices. Also included are dielectric substrates which can be thermoplastic and/or thermosetting polymers. Typical thermosetting polymeric materials include epoxy, phenolic-based materials, polyamides, and polyimides. The dielectric materials may be molded articles of the polymeric materials containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyolefins such as polypropylene; polysulfones; polycarbonates; nitrile rubber; and ABS polymers.

The compositions of the present invention can be used as the top imaging layer in a double layer resist system for the oxygen plasma etching of an underlying planarizing polymer layer since the compositions of the present invention are resistant to the conditions of the plasma etching.

The compositions of the present invention, when used in a double layer system, are employed as the top imaging layer. In particular, the compositions of the present invention are exposed to actinic radiation and then developed. Being negative resist materials, that portion exposed to the actinic radiation remains in place and acts as an etch mask for pattern transfer to the underlying planarizing polymer in a reactive ion etching oxygen plasma.

In optical lithography the double-layer system eliminates standing wave effects in resist which cause line width variation when resist is imaged over topographies of different reflectivities and refractive index. Also causing line width variation are differences in exposure dose caused by thickness variations when the planarizing resist layer is coated over topography. These thickness effects are minimized when imaging a uniform thin layer over a planarizing polymer.

In electron beam lithography the double layer system also reduces proximity effects in addition to the other benefits discussed above.

Because the compositions are negative resists, the line width is independent of development time and no swelling has been observed, most likely because the film is relatively thin.

The compositions of the present invention, after being coated to the desired thickness upon a substrate, are exposed to the deep ultraviolet light, electron beam, X-ray, or ion beams.

The unexposed portions are removed with a suitable solvent.

Suitable solvents include methyl isobutyl ketone, diglyme, propylene glycol, methyl ether acetate, and anisole.

The following non-limiting examples are provided to further illustrate the present invention:

EXAMPLE 1

A silylated epoxy novolak is obtained by reacting 10.45 grams of a 43 weight percent solution of an epoxy novolak resin (Quatrex 3710 from Dow) in diglyme with about 7.9 grams of tris (trimethylsiloxy) chlorosilane in the presence of about 0.2 grams of pyridine at 40° C. to 50° C. for about 4 hours. The silylated epoxy novolak is obtained from the reaction mass by distillation, followed by precipitation.

About 10 grams of the silylated epoxy novolak thus obtained are admixed with about 0.2 grams of triphenyl sulfonium hexafluoride antimonate. The composition is coated onto a silicon substrate and exposed imagewise in a predetermined pattern to deep ultraviolet light irradiation. The composition crosslinks at 2800 angstroms at about 10 millijoules/cm$^2$ or at 2-3 $\mu$C/cm$^2$ with electron beams at 20 KV. The layer is developed by dissolving the unexposed material in methyl isobutyl ketone, followed by rinse in isopropyl alcohol. The underlying layer is etched in an oxygen plasma at about 30 millitorr.

The composition provides high resolution and increased sensitivity, as well as oxygen plasma resistance.

EXAMPLE 2

A silylated epoxy novolak is obtained by reacting 10.45 grams of a 43 weight percent solution of an epoxy novolak resin (Quatrex 3710 from Dow Corning) in diglyme with about 1.41 grams of trimethyl silyl chloride in the presence of about 0.2 grams of pyridine at about room temperature for about 4 hours. The silylated epoxy novolak is obtained from the reaction mass by distillation and precipitation.

About 10 grams of the silylated epoxy novolak thus obtained are admixed with about 0.2 grams of triphenyl sulfonium hexafluoride antimonate. The composition is coated onto a silicon substrate and exposed imagewise in a predetermined pattern to deep ultraviolet light irradiation. The composition crosslinks at 2800 angstroms at about 10 millijoules/cm$^2$ or at 2-3 $\mu$C/cm$^2$ with electron beams at 20 KV. The layer is developed by dissolving the unexposed material in methyl isobutyl ketone, followed by rinse in isopropyl alcohol. The underlying layer is etched in an oxygen plasma at about 30 millitorr.

The composition provides high resolution and increased sensitivity, as well as oxygen plasma resistance.

Having thus described our invention, what we claim as new and desire to secure by Letters Patent:

1. A radiation sensitive negative resist composition comprising:
   A) a polymeric material obtained by interreacting an epoxy novolak polymer with a monomeric organosilicon compound such that sufficient epoxy groups remain unreacted to provide for the desired degree of crosslinking when exposed to irradiation; and wherein the amount of the organosilicon compound is about 0.25 to about 0.75 moles per mole of epoxy novolak;
   B) a radiation sensitive onium salt in an amount sufficient to increase the sensitivity of the composition to irradiation.

2. The composition of claim 1 wherein said organosilicon compound is tris (trimethylsiloxy) chlorosilane.

3. The composition of claim 1 wherein said organosilicon compound is trimethylsilyl chloride.

4. The composition of claim 1 wherein said onium salt is an aromatic salt of a Group IVa element.

5. The composition of claim 1 wherein said onium salt is triphenyl sulfonium hexafluoride antimonate.

6. The composition of claim 1 further including a sensitizer material to make the composition sensitive to near U.V. radiation.

7. The composition of claim 1 wherein the amount of organosilicon compound is about 0.4 to about 0.6 moles per mole of epoxy novolak.

8. The composition of claim 1 wherein about 70% to about 40% of said available epoxy groups remain unreacted prior to exposure to irradiation.

9. The composition of claim 1 wherein about 75% to about 50% of said available epoxy groups remain unreacted prior to exposure to irradiation.

10. A process for producing an image which comprises providing on a substrate a layer of an actinic radiation sensitive negative resist composition containing:
    A) a polymer material obtained by interreacting an epoxy novolak polymer with a monomeric organosilicon compound such that sufficient epoxy groups remain unreacted to provide for the desired degree of crosslinking when exposed to irradiation; and wherein the amount of the organosilicon compound is about 0.25 to about 0.75 moles per mole of epoxy novolak;
    B) a radiation sensitive onium salt; imagewise exposing the layer of radiation-sensitive composition to imaging radiation in a desired pattern and developing the exposed layer by removing the unexposed portions of the layer, thereby leaving the desired pattern of the layer of light-sensitive negative resist composition remaining on the substrate.

11. The process of claim 10 further comprises etching the substrate by a dry etching process using the pattern of the layer of said radiation-sensitive negative resist composition as the mask.

12. The process of claim 10 further providing a sensitizer material to make the resist composition sensitive to near U.V. radiation.

13. The process of claim 10 wherein about 70% to about 40% of said available epoxy groups remain unreacted prior to exposure to irradiation.

14. The process of claim 10 wherein about 75% to about 50% of said available epoxy groups remain unreacted prior to exposure to irradiation.

15. The process of claim 10 wherein the amount of the organosilicon compound is about 0.4 to about 0.6 moles per mole of epoxy novolak.

16. The process of claim 1 wherein said organosilicon compound is tris (trimethylsiloxy) chlorosilane.

17. The process of claim 10 wherein said organosilicon compound is trimethylsilyl chloride.

18. The process of claim 10 wherein said onium salt is an aromatic salt of a Group IVa element.

19. The process of claim 10 wherein said onium salt is triphenyl sulfonium hexafluoride antimonate.

* * * * *